United States Patent [19]
Williamson

[11] Patent Number: 5,956,192
[45] Date of Patent: Sep. 21, 1999

[54] FOUR MIRROR EUV PROJECTION OPTICS

[75] Inventor: David M. Williamson, West Malvern, United Kingdom

[73] Assignee: SVG Lithography Systems, Inc., Wilton, Conn.

[21] Appl. No.: 08/933,272

[22] Filed: Sep. 18, 1997

[51] Int. Cl.[6] .............................. G02B 5/10; G02B 17/00; G02B 21/00
[52] U.S. Cl. .......................... 359/859; 359/366; 359/731
[58] Field of Search .................... 359/364, 365, 359/366, 729, 731, 859, 858

[56] References Cited

U.S. PATENT DOCUMENTS

| | | | |
|---|---|---|---|
| 3,748,015 | 7/1973 | Offner | 359/366 |
| 4,240,707 | 12/1980 | Wetherell et al. | 359/859 |
| 4,733,955 | 3/1988 | Cook | 359/859 |
| 4,747,678 | 5/1988 | Shafer et al. | 359/366 |
| 5,063,586 | 11/1991 | Jewell et al. | 378/34 |
| 5,153,898 | 10/1992 | Suzuki et al. | 378/34 |
| 5,315,629 | 5/1994 | Jewell et al. | 378/34 |
| 5,353,322 | 10/1994 | Bruning et al. | 378/34 |
| 5,410,434 | 4/1995 | Shafer | 359/858 |

*Primary Examiner*—Cassandra Spyrou
*Assistant Examiner*—Mark A. Robinson
*Attorney, Agent, or Firm*—Fattibene & Fattibene; Paul A. Fattibene; Arthur T. Fattibene

[57] ABSTRACT

An all reflective ring field projection optic system for use in scanning photolithography used in the manufacture of semiconductor wafers. The projection optics are designed for wavelengths in the extreme ultraviolet ranging from 11 to 13 nm to provide an arcuate image field for a reduction step and scan photolithography system. A sequence or configuration of mirrors from the long conjugate end to the short conjugate end consists of a convex, concave, convex, and concave mirror with an aperture stop being formed at or near the second convex mirror. This sequence of mirror powers provides a relatively large image field size while maintaining a relatively compact reticle wafer distance of less than 900 mm. The projection optics form an instantaneous annual field of up to 50 mm×2 mm at the wafer, permitting scanning to cover a field on a wafer of at least 50 mm×50 mm, greatly increasing throughput. The optical projection system can print features as small as 0.05 microns.

14 Claims, 2 Drawing Sheets

FOUR MIRROR EUV PROJECTION OPTICS

FIELD OF THE INVENTION

The present invention relates in general to semiconductor manufacturing using photolithography or microlithography, and more particularly to an optical projection system for use in the extreme ultraviolet wavelength region, for example from 11 to 13 nm.

BACKGROUND OF THE INVENTION

Semiconductor devices are typically manufactured by projecting an image of a reticle containing a circuit pattern onto a photosensitive resist covered wafer. As the feature size of the circuit elements become smaller, there is a need for the use of smaller or shorter wavelengths of light or electromagnetic radiation use in exposing the photosensitive resist covered wafer. However, many difficulties arise in developing optical designs for projecting the image of a reticle onto a photosensitive substrate at the required short wavelengths of electromagnetic radiation in the extreme ultraviolet and soft X-ray region. One such optical projection system is disclosed in U.S. Pat. No. 5,353,322 entitled "Lens Systems For X-Ray Projection Lithography Camera" issuing to Bruning et al on Oct. 4, 1994. Therein disclosed is a three mirror projection system used in lithography at X-ray wavelengths to image a mask on a wafer. Also disclosed is a methodology for providing optimum solutions within regions of two dimensional magnification space defined by the magnification of a convex mirror as one coordinate and the ratio of the magnification of a pair of concave mirrors optically on opposite sides of the convex mirror as another coordinate. An optical system is discloses having, from the image to the object end, a concave mirror, a convex mirror, and a concave mirror. Bruning et al specifically advocates the use of a three-mirror system as opposed to other two and four mirror systems. While this optical system permits small residual aberrations over a relatively large field, there is a lack of an accessible aperture stop. Additionally, there is the disadvantage that there will be subtle variations in effective numerical aperture, and therefore image size around the annular field. Another projection optical system is disclosed in U.S. Pat. No. 5,315,629 entitled "Ring Field Lithography" and issuing to Jewell et al on May 24, 1994. Therein disclosed is a ring field projection apparatus for use with X-ray radiation that has a relatively large slit width of at least 0.5 mm. A folding mirror is also disclosed so that the projection optics can be placed between the mask and wafer. Therein disclosed is a mirror configuration or sequence from the reticle or object to the wafer or image of a concave mirror, a convex mirror, a concave mirror, and a convex mirror. Jewell et al specifically teaches away from the use of a negative or convex first mirror indicating that it was found that the telecentric requirement in unobscured configuration could not be met. While the prior art projection optical systems have proven adequate for many applications, they are not without design compromises that may not provide an optimum solution in all applications. Therefore, there is a need for a projection optical system that can be used in the extreme ultraviolet(EUV) or soft X-ray wavelength region that has a relatively large image field with acceptable imaging for improving throughput. It is also desirable that the image field have an acceptable aspect ratio. This reduces the difficulty of providing illumination uniformity as compared to narrow slits with a high aspect ratio.

SUMMARY OF THE PRESENT INVENTION

The present invention relates to an all reflecting ring field projection optical system designed for use with wavelengths in the extreme ultraviolet, including wavelengths in the 11 to 13 nm range, or soft X-rays. The present invention comprises a plurality of curved mirrors providing a reduction from a long conjugate end to a short conjugate end. The mirror order or sequence from the long conjugate end to the short conjugate end is a first negative power convex mirror, a first positive power concave mirror, a second negative convex mirror, and a second positive concave mirror. The plurality of curved mirrors are arranged such that an aperture stop is coincident at or near the third mirror or second negative convex mirror. The reflective surfaces of each mirror are spaced or separated by a distance greater than twenty-five percent of the total distance between the long conjugate end and the short conjugate end.

Accordingly, it is an object of the present invention to provide a projection optical system that has a relatively large image field size.

It is another object of the present invention to provide an accessible aperture stop.

It is an advantage of the present invention that a variable iris may be utilized at the aperture stop.

It is another advantage of the present invention that the object and image positions are located or positioned to facilitate scanning.

It is an advantage of the present invention that it can print feature sizes as small as 0.05 microns and has a slot width of 2 mm.

It is a feature of the present invention that the first mirror from the long conjugate end to the short conjugate end is a negative power convex mirror.

It is another feature of the present invention that the mirrors are spaced relatively far apart to minimize the angular variations of light beams hitting the mirrors.

These and other objects, advantages, and features will become readily apparent in view of the following detailed description.

DETAILED DESCRIPTION OF THE PREFERRED EMBODIMENTS

Figure 1:
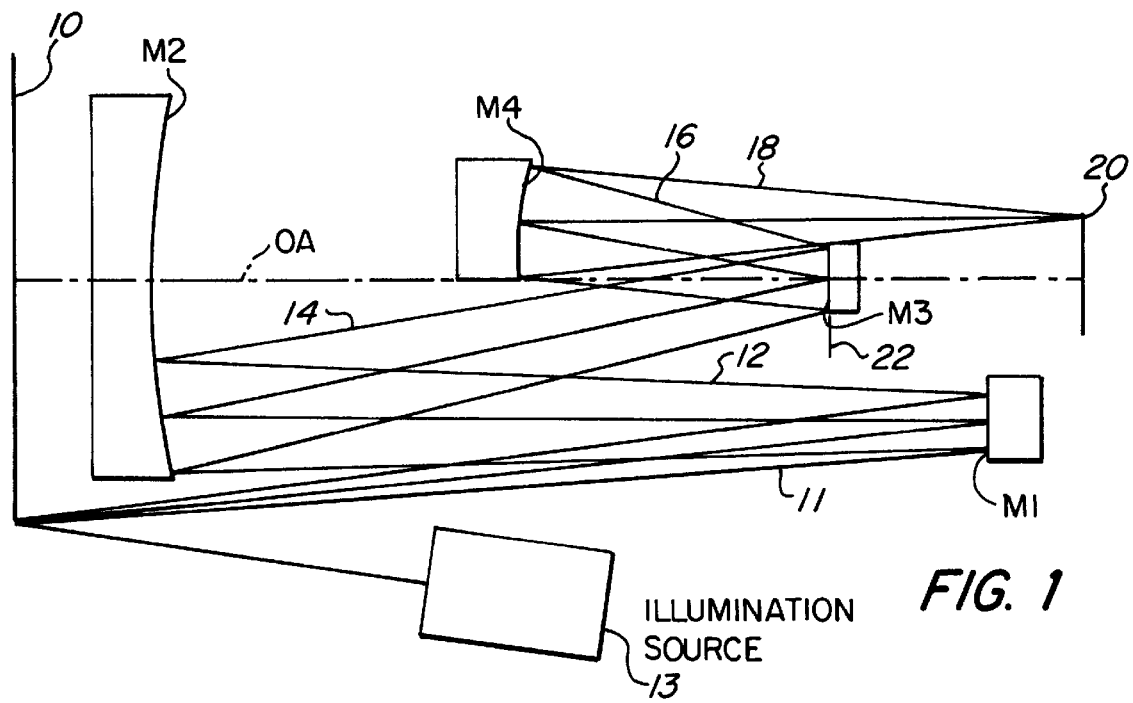
FIG. 1 is a schematic illustration of the projection optical system of the present invention.

FIG. 1 schematically illustrates one embodiment of the present invention. An illumination source 13, which may be any illumination source that can provide electromagnetic radiation in the desired wavelength in the extreme ultraviolet, for example in the range from 11 to 12 nm. The illumination source 13 may provide a desired illumination profile and intensity. For example, an intensity distribution that is not uniform along one dimension, such as a radial width, and is uniform along another dimension, such as in a tangent field direction or along the length of an arc, may be utilized thereby providing Kohler illumination or a uniform intensity distribution. The electromagnetic radiation from illumination source 13 is received by reticle 10. Reticle 10 is preferably a reticle having a predetermined line pattern thereon which is used for the manufacture of semiconductor devices. Reticle 10 may be of the reflective type as illustrated, or a transmissive type. The reticle 10 is placed at the long conjugate end of the reduction optical system. The electromagnetic radiation reflected from reticle 10 is collected by a first convex mirror M1. The rays 11 of electromagnetic radiation from the reticle 10 diverge. The first convex mirror M1 has a negative power and causes the rays 12 of electromagnetic radiation reflected from the convex mirror M1 to also diverge. The rays 12 of electromagnetic radiation reflected from the convex mirror M1 are collected by a concave mirror M2. The concave mirror M2 has a positive power causing the rays 14 of electromagnetic radiation reflected therefrom to converge. The rays 14 of electromagnetic radiation reflected from concave mirror M2 are collected by convex mirror M3. An aperture stop 22 is formed at or near the surface of convex mirror M3. Convex mirror M3 has a negative power causing the rays 16 of electromagnetic radiation reflected therefrom to diverge. The rays 16 of electromagnetic radiation reflected from convex mirror M3 are collected by concave mirror M4. The rays 18 of electromagnetic radiation reflected from concave mirror M4 are imaged onto a wafer 20 at an image plane. Wafer 20 is placed at the short conjugate end of the reduction optical system. The mirrors M1, M2, M3, and M4 preferably have a common optical axis OA. The rays 11, 12, 14, 16, and 18 form the optical path of the electromagnetic radiation in the optical system. The mirrors M1, M2, M3, and M4 are preferably spaced relatively far apart. This has the benefit of minimizing the angular variations of light beams or rays 11, 12, 14, 16, and 18 hitting the mirrors M1, M2, M3, and M4. This improves system performance in that known reflective coatings typically used for extreme ultra violet wavelengths (EUV) are angle-sensitive. Additionally, this allows for a larger ring field radius for a given reticle 10 to wafer 20 distance. The following distances are therefore preferable. The distance between the reticle 10 and the reflective surface of mirror M1 being greater than eighty percent of the distance between the reticle 10 and wafer 20. The distance between the reflective surfaces of mirrors M1 and M2 being greater than seventy percent of the distance between the reticle 10 and wafer 20. The distance between the reflective surfaces of mirrors M2 and M3 being greater than fifty percent of the distance between the reticle 10 and wafer 20. The distance between the reflective surfaces of mirrors M3 and M4 being greater than twenty-five percent of the distance between the reticle 10 and wafer 20. The distance between the reflective surface of mirror M4 and the wafer being greater than fifty percent of the distance between the reticle 10 and wafer 20.

In a preferred configuration the optical system, illustrated in FIG. 1, may be made according to the construction data of the following Tables 1 and 1A. The construction data contains some un-numbered surfaces referred to as dummies by those skilled in the art and are typically needed for the design to control the passage of light beams next to the mirrors. The un-numbered surfaces could be removed, however the thickness or distance before and after them would be added so that the thickness or distance between the mirrors remains the same.

TABLE 1

| Element Number | Radius of Curvature | Thickness | Aperture Diameter | Glass |
|---|---|---|---|---|
| Object | Infinite | 125.0000 | | |
| | | | 384.9520 | |
| | | 682.5197 | | |
| 1 | A(1) | −682.5197 | 282.3516 | Reflective |
| 2 | A(2) | 556.6306 | 318.7516 | Reflective |
| | | Aperture Stop | 50.0710 | |
| 3 | A(3) | −556.6306 | 50.0710 | Reflective |
| | | | 365.8025 | |
| | | 299.9381 | | |
| 4 | A(4) | −299.9381 | 194.4209 | Reflective |
| | | | 255.2926 | |
| | | 556.6306 | | |
| | | | 142.7533 | |
| | Image Distance = | 209.2224 | | |
| Image | Infinite | | 102.0002 | |

The aspheric constants are provided according to the following equation and Table 1A

TABLE 1A $$z = \frac{(\text{curv})y^2}{1 + (1 - (1 + K)(\text{curv})^2 y^2)^{1/2}} + (A)y^4 + (B)y^6 + (C)y^8 + (D)y^{10}$$

| Aspheric | Curv | K | A | B | C | D |
|---|---|---|---|---|---|---|
| A(1) | 0.00038658 | 0.000000 | −1.94905E-10 | −9.77521E-17 | 7.55027E-21 | −3.03099E-25 |
| A(2) | 0.00084708 | 0.000000 | −6.71274E-11 | −8.42747E-17 | −8.35108E-22 | 9.74444E-28 |
| A(3) | 0.00243452 | 0.000000 | 5.25375E-10 | −3.50002E-15 | 1.26244E-17 | −7.16624E-21 |
| A(4) | 0.00196174 | 0.000000 | 1.28463E-10 | 7.98681E-16 | −1.24539E-20 | 5.30348E-25 |

The optical projection system of the present invention, constructed according to the construction data of Tables 1 and 1A, has a maximum numerical aperture equal to 0.1 and a four-to-one reduction ratio. A step and scan photolithography system using this projection system will be able to print features as small as 0.05 microns over an instantaneous annular image field of up to 50 mm×2 mm at the wafer. This image field can be scanned to cover a field on the wafer of at least 50 mm×50 mm, thereby allowing a dramatic increase in circuit pattern density and complexity over current deep UV, 193 to 248 nm photolithography systems. The relatively large image field greatly increases throughput and thereby increases the efficiency of systems utilizing the present invention. The projection optics of the present invention are also relatively compact, having a reticle to wafer distance of less than 900 mm.

Figure 2:
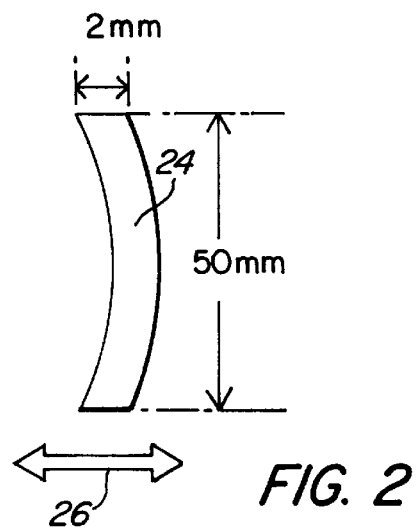
FIG. 2 is a plan view of the ring portion or arcuate image field provided by the present invention.

FIG. 2 illustrates the image field created by the present invention. The image field 24 is an arcuate slit having a lateral dimension of approximately 2 mm and a longitudinal dimension of about 50 mm. The image field 24 is generally scanned in the direction of arrow 26. The arcuate or annular slit is formed from portions of concentric circles having a radii of 49 and 51 mm, respectively. At the wafer, the residual design aberrations are smaller than the Marechal criterion for diffraction limited imagery, 0.07 waves r.m.s. at an 11 nm wavelength. This system will likely be illuminated over the central 1.5 mm of the aberration corrected annulus, with an intensity distribution peaked near a central 50 mm field radius and following that of the point source in the radial field direction, so called critical illumination. Kohler illumination, uniform intensity distribution, is assumed in the tangential field direction. The system is telecentric at the wafer, but not at the reticle. This allows for oblique illumination of a spectrally reflected reticle, as is well known in the art.

The present invention, by utilizing the unique mirror sequence of convex, concave, convex, and concave, in combination with an aperture stop coincident with the third mirror, makes possible very efficient projection optics having a relatively large annular image field. This results in improved throughput and therefore manufacturing efficiencies. Accordingly, the present invention advances the art of microlithography or photolithography and in particular, reduction projection optics used for a scanning lithographic system.

Figure 3:
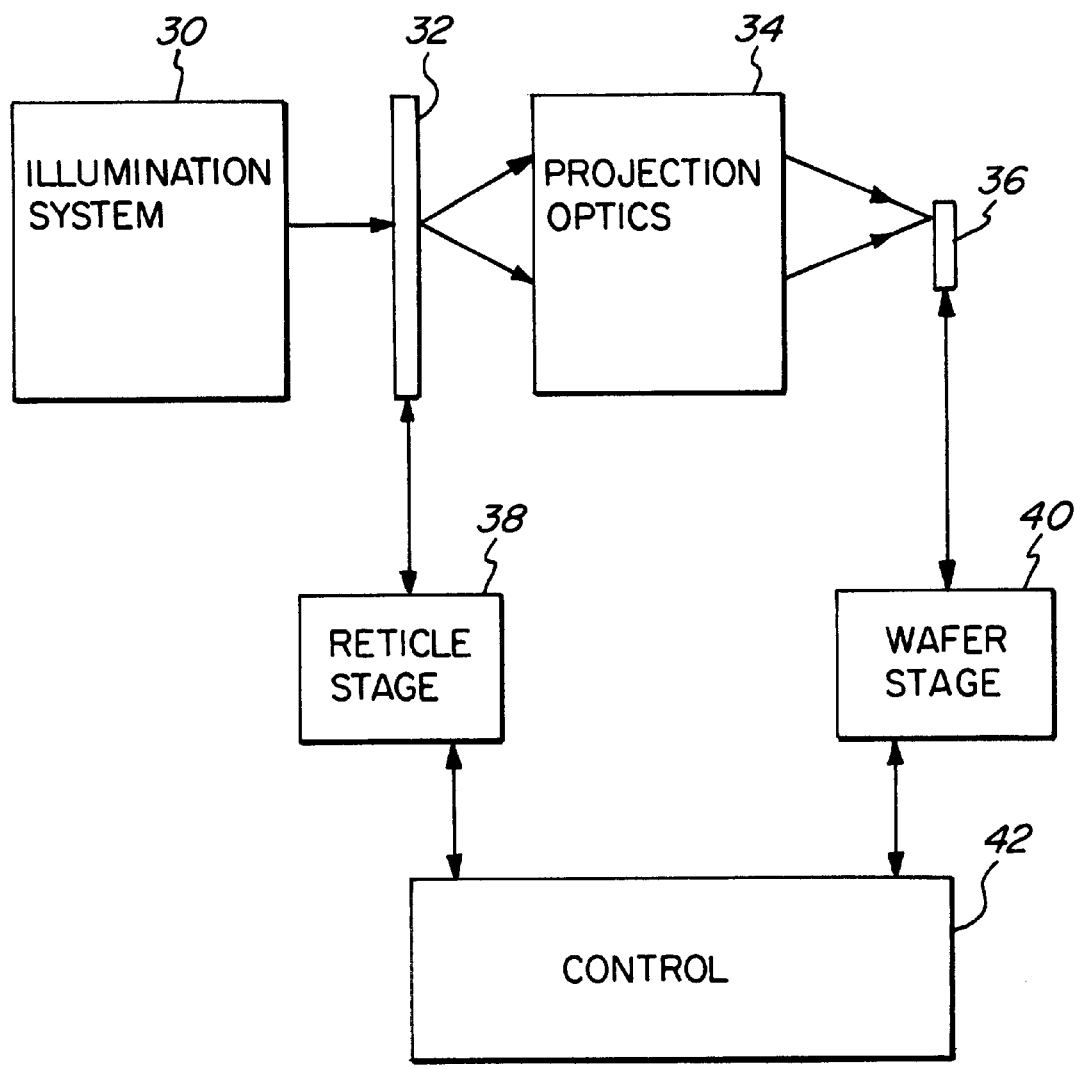
FIG. 3 is a schematic drawing illustrating the use of the present invention in a scanning microlithographic apparatus.

FIG. 3 is a block diagram illustrating generally a microlithography system utilizing projection optics according to the present invention. An illumination system 30 illuminates a transmissive reticle 32. Projection optics 34, according to the present invention, project the image of the reticle 32 onto a photosensitive resist covered substrate or wafer 36. Only a portion of the image of the reticle 32 is projected onto the wafer 36 at any one time. The image field of the projection optics 34 being smaller then the reticle 32 or wafer 36, the entire wafer 36 is exposed by scanning the reticle and wafer. Both the reticle stage 38 and wafer stage 40 move in synchronization. However, because the optical system provides reduction, the reticle stage 38 moves at a different rate than the wafer stage 40. The difference in rate is proportional to the reduction. Control 42 controls the movement of the reticle stage 38 and wafer stage 40.

Although the preferred embodiment has been illustrated and described, it will be obvious to those skilled in the art that various modifications may be made without departing from the spirit and scope of this invention.

What is claimed is:

1. A ring field reduction projection optical system having a single optical axis and an optical path, from a long conjugate end to a short conjugate end comprising:

a first convex mirror;

a first concave mirror;

a second convex mirror; and a second concave mirror, arranged such that electromagnetic radiation is reflected along the optical path from said first convex mirror to said first concave mirror to said second convex mirror to said second concave mirror and a first distance along the optical axis between the long conjugate end and said first convex mirror is greater than eighty percent of the distance along the optical axis between the long conjugate end and the short conjugate end, and the first distance is greater than a second distance along the optical axis between said first convex mirror and said first concave mirror, and the second distance is greater than a third distance along the optical axis between said first concave mirror and said second concave mirror, and the third distance is greater than a fourth distance along the optical axis between said second convex mirror and said second concave mirror, wherein said first convex mirror, said first concave mirror, said second convex mirror, and said second concave mirror are positioned between a first plane formed by the long conjugate end and a second plane formed by the short conjugate end while progressing in a single direction along the optical axis, said first plane and said second plane being parallel, whereby a telecentric image field is formed at the short conjugate end and the first and second planes are accessible for parallel scanning.

2. A ring field reduction projection optical system as in claim 1 wherein:

the image field has at least 0.1 micron resolution and a radial width of 2 mm and a longitudinal length of substantially 50 mm.

3. A ring field reduction projection optical system as in claim 1 wherein:

said first concave mirror is positioned along the optical axis between the long conjugate end and said second concave mirror.

4. A ring field reduction projection optical system as in claim 1 wherein:

said second convex mirror is positioned along the optical axis between said second concave mirror and said first convex mirror and adjacent said second concave mirror.

5. A ring field reduction projection optical system as in claim 1 wherein:

an aperture stop is formed near said second convex mirror.

6. A ring field reduction projection optical system as in claim 1 wherein:

said first convex mirror forms rays of electromagnetic radiation that diverge along the optical path between the long conjugate end and the short conjugate end.

7. A ring field reduction projection optical system as in claim 6 wherein:

said first concave mirror forms rays of electromagnetic radiation that converge along the optical path between the long conjugate end and the short conjugate end.

8. A ring field reduction projection optical system along an optical path, from a long conjugate end to a short conjugate end comprising:

a first convex mirror(M1);

a first concave mirror(M2);

a second convex mirror(M3); and a second concave mirror(M4), arranged such that electromagnetic radiation is reflected from said first convex mirror to said first concave mirror to said second convex mirror to said second concave mirror and the positioning along an optical axis(OA) is such that said first convex mirror(M1) is positioned between the short conjugate end and said second convex mirror(M3), said first concave mirror (M2) is positioned between the long conjugate end and said second concave mirror(M4), said second convex mirror(M3) is positioned between said first convex mirror(Ml) and said second concave mirror(M4), and said second concave mirror(M4) is positioned between said first concave mirror(M2) and said second convex mirror(M3), wherein said first convex mirror(M1), said first concave mirror(M2), said second convex mirror(M3), and said second concave mirror(M3) are positioned between a first plane formed by the lone conjugate end and a second plane formed by the short conjugate end while progressing in a single direction alone the optical axis(OA), said first plane and said second plane being parallel, whereby an image field is formed at the short conjugate end and the first and second planes are accessible for parallel scanning.

9. A ring field reduction projection optical system as in claim 8 wherein:

said first convex mirror(M1), said first concave mirror (M2), said second convex mirror(M3), and said second concave mirror(M4) have aspheric reflective surfaces.

10. A ring field reduction projection optical system as in claim 8 wherein:

the image field has at least 0.1 micron resolution and a radial width of 2 mm and a longitudinal length of substantially 50 mm.

11. A ring field reduction projection optical system having an optical axis, an optical path, and a length from a long conjugate end to a short conjugate end comprising:

a first convex mirror;

a first concave mirror;

a second convex mirror; and a second concave mirror, arranged such that electromagnetic radiation is reflected along the optical path from said first convex mirror to said first concave mirror to said second convex mirror to said second concave mirror, and the distance between each of the reflective surfaces of said mirrors in a direction of the optical path along the optical axis is greater than twenty-five percent of the length from the long conjugate end to the short conjugate end, and said first convex mirror, said first concave mirror, said second convex mirror, and said second concave mirror are positioned between a first plane formed by the long conjugate end and a second plane formed by the short conjugate end while progressing in a single direction along the optical axis, the first plane and second plane being parallel, whereby an image field is formed.

12. A ring field reduction projection optical system having an optical axis, an optical path, and a length from a long conjugate end to a short conjugate end comprising:

a first convex mirror positioned from the long conjugate end in a direction of the optical path a first distance greater than eighty percent of the length;

a first concave mirror positioned from said first convex mirror in a direction of the optical path a second distance greater than seventy percent of the length;

a second convex mirror positioned from said first concave mirror in a direction of the optical path a third distance greater than fifty percent of the length; and a second concave mirror positioned from said second convex mirror in a direction of the optical path a fourth distance greater than twenty-five percent of the length, arranged such that electromagnetic radiation is reflected along the optical path from said first convex mirror to said first concave mirror to said second convex mirror to said second concave mirror, and said first convex mirror, said first concave mirror, said second convex mirror, and said second concave mirror are positioned between a first plane formed by the long conjugate end and a second plane formed by the short conjugate end while progressing in a single direction along the optical axis, said first and second planes being parallel, whereby an image field is formed at the short conjugate end and the first and second planes are accessible for parallel scanning.

13. A ring field reduction projection optical system as in claim 12 wherein:

said second concave mirror is positioned from the short conjugate end a fifth distance greater than fifty percent of the length.

14. A ring field reduction projection optical system, from the long conjugate end to the short conjugate end comprising:

a first convex mirror;

a first concave mirror;

a second convex mirror; and a second concave mirror, arranged such that electromagnetic radiation is reflected from said first convex mirror to said first concave mirror to said second convex mirror to said second concave mirror, and constructed according the to following construction data,

TABLE 1

| Element Number | Radius of Curvature | Thickness (mm) | Aperture Diameter (mm) | Glass |
|---|---|---|---|---|
| Object | Infinite | 125.0000 | | |
| DummySurface | | | 384.9520 | |
| DummySurface | | 682.5197 | | |
| 1 | A(1) | −682.5197 | 282.3516 | Reflective |
| 2 | A(2) | 556.6306 | 318.7516 | Reflective |
| | | Aperture Stop | 50.0710 | |
| 3 | A(3) | −556.6306 | 50.0710 | Reflective |
| DummySurface | | | 365.8025 | |
| DummySurface | | 299.9381 | | |
| 4 | A(4) | −299.9381 | 194.4209 | Reflective |
| DummySurface | | | 255.2926 | |
| DummySurface | | 556.6306 | | |
| DummySurface | | | 142.7533 | |
| | Image Distance = | 209.2224 | | |
| Image | Infinite | | 102.0002 | | and the aspheric constants A(1), A(2), A(3), an A(4) are provided according to the following equation and Table 1A,

TABLE 1A $$z = \frac{(curv)y^2}{1 + (1 - (1 + K)(curv)^2 y^2)^{1/2}} + (A)y^4 + (B)y^6 + (C)y^8 + (D)y^{10}$$

| Aspheric | Curv | K | A | B | C | D |
|---|---|---|---|---|---|---|
| A(1) | 0.00038658 | 0.000000 | −1.94905E-10 | −9.77521E-17 | 7.55027E-21 | −3.03099E-25 |
| A(2) | 0.00084708 | 0.000000 | −6.71274E-11 | −8.42747E-17 | −8.35108E-22 | 9.74444E-28 |
| A(3) | 0.00243452 | 0.000000 | 5.25375E-10 | −3.50002E-15 | 1.26244E-17 | −7.16624E-21 |
| A(4) | 0.00196174 | 0.000000 | 1.28463E-10 | 7.98681E-16 | −1.24539E-20 | 5.30348E-25 | whereby an image field is formed.

\* \* \* \* \*